US012564901B2

(12) United States Patent
Ye et al.

(10) Patent No.: US 12,564,901 B2
(45) Date of Patent: Mar. 3, 2026

(54) PREPARATION METHOD OF HIGH-SENSITIVITY TERAHERTZ SENSOR

(71) Applicant: Jiangsu University, Jiangsu (CN)

(72) Inventors: Yunxia Ye, Jiangsu (CN); Tonglin Mou, Jiangsu (CN); Yabo Zhang, Jiangsu (CN); Rui Zhao, Jiangsu (CN); Zijie Dai, Jiangsu (CN); Xudong Ren, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 18/867,447

(22) PCT Filed: Apr. 12, 2023

(86) PCT No.: PCT/CN2023/087753
§ 371 (c)(1),
(2) Date: Nov. 20, 2024

(87) PCT Pub. No.: WO2023/221692
PCT Pub. Date: Nov. 23, 2023

(65) Prior Publication Data
US 2025/0345885 A1 Nov. 13, 2025

(30) Foreign Application Priority Data

May 20, 2022 (CN) .......................... 202210549192.6

(51) Int. Cl.
B23K 26/354 (2014.01)
B23K 103/08 (2006.01)
G01R 29/08 (2006.01)

(52) U.S. Cl.
CPC ........ B23K 26/354 (2015.10); G01R 29/0878 (2013.01); B23K 2103/08 (2018.08)

(58) Field of Classification Search
CPC .............. B23K 26/354; B23K 2103/08; G01R 29/0878
See application file for complete search history.

(56) References Cited

FOREIGN PATENT DOCUMENTS

CN          103072940          5/2013
CN          114002181          2/2022
(Continued)

OTHER PUBLICATIONS

Abramovich et al. ("Real-Time Metasurface Sensor for Monitoring Micropoisons in aqueous solutions based on gold nanoparticles and Terahertz Spectroscopy". Sensors 2022) (Year: 2022).*
(Continued)

*Primary Examiner* — Ricardo D Morales
(74) *Attorney, Agent, or Firm* — JCIPRNET

(57) ABSTRACT

The present disclosure provides a high-sensitivity terahertz sensor. The high-sensitivity terahertz sensor includes a substrate; a metal microstructure array, including a plurality of metal microstructure units, and covering the substrate to form a metasurface; and metal nanostructures, located at gaps of the metal microstructure array, where the metal microstructure array and the metal nanostructures are formed by etching a metal film on the substrate through pulsed laser direct writing. The present disclosure utilizes the metasurface and the metal nanostructures to cooperatively enhance the terahertz wave, promoting full interaction between the terahertz wave and the analyte and improving terahertz detection sensitivity.

7 Claims, 4 Drawing Sheets

(56)            References Cited

FOREIGN PATENT DOCUMENTS

| CN | 114374095 | 4/2022 |
|----|-----------|--------|
| CN | 114942232 | 8/2022 |
| KR | 20180020614 | 2/2018 |
| WO | 2021191768 | 9/2021 |

OTHER PUBLICATIONS

"International Search Report (Form PCT/ISA/210) of PCT/CN2023/087753", mailed on Jul. 16, 2023, with English translation thereof, pp. 1-6.

Harim Oh et al., "Laser dewetting behaviors of Ag and Au thin films on glass and Si substrates: Experiments and theoretical considerations", Applied Surface Science, vol. 475, Jan. 2019, pp. 740-747.

Amir Abramovich et al., "Real-Time Metasurface Sensor for Monitoring Micropoisons in Aqueous Solutions Based on Gold Nanoparticles and Terahertz Spectroscopy", Sensors, vol. 22, Feb. 2022, pp. 1-11.

* cited by examiner

PREPARATION METHOD OF HIGH-SENSITIVITY TERAHERTZ SENSOR

CROSS-REFERENCE TO RELATED APPLICATION

This application is a 371 application of the international PCT application serial no. PCT/CN2023/087753, filed on Apr. 12, 2023, which claims the priority benefit of China application no. 202210549192.6, filed on May 20, 2022. The entirety of each of the above-mentioned patent applications is hereby incorporated by reference herein and made a part of this specification.

TECHNICAL FIELD

The present disclosure relates to the technical field of sensor preparation, and in particular to a high-sensitivity terahertz sensor and a preparation method thereof.

BACKGROUND

Terahertz waves are located in the intermediate transition region between electronics and photonics, and have numerous unique advantages. Terahertz waves have strong transmission ability and can be transmitted through most nonpolar substances and dielectric materials well, so they can be used for perspective imaging, non-destructive detection, etc. Terahertz waves have the characteristic of "fingerprint spectrum". The vibrational and rotational energy level transitions between most of the biomolecules and polar molecules occur precisely within the terahertz frequency range. Therefore, terahertz waves can be used to resonate with substance molecules to effectively identify the composition of substances and detect the substance content. Terahertz waves have very low photon energy, so they will not cause thermal damage to the body and biological tissues or produce ionizing radiation harmful to biological tissues. However, due to the limited technological level, the sensitivity of substance identification using terahertz sources directly is relatively low.

In order to solve the low energy problem of terahertz sources, researchers mainly use metasurface sensors to enhance the sensitivity of terahertz detection. Metasurfaces are a type of artificial composite material with subwavelength structural units. With a rationally designed structure, terahertz metasurfaces are highly sensitive to changes in the dielectric constant caused by sample addition, thereby achieving high-sensitivity detection of substances. Specifically, when terahertz waves are incident on a metasurface, the metasurface generates field enhancement. Thus, the interaction between terahertz waves and the molecules of the detected substance is enhanced, thereby improving the detection sensitivity of terahertz spectroscopy technology. However, high-sensitivity metasurfaces require complex structural design, and currently, the metasurface preparation process mainly based on photolithography is complex, costly, and time-consuming. Therefore, it is urgent to design a terahertz sensor with higher sensitivity and propose a new and simple preparation method to promote the application of terahertz sensing technology.

SUMMARY

In order to address the shortcomings of the prior art, the present disclosure provides a high-sensitivity terahertz sensor. The present disclosure utilizes a metasurface and metal nanostructures to cooperatively enhance a terahertz wave, promoting full interaction between the terahertz wave and an analyte and improving terahertz detection sensitivity.

The present disclosure achieves the above technical objective through the following technical solutions.

A high-sensitivity terahertz sensor includes:

a substrate;

a metal microstructure array, including a plurality of metal microstructure units, and covering the substrate to form a metasurface; and metal nanostructures, located at gaps of the metal microstructure array;

where, the metal microstructure array and the metal nanostructures are formed by etching a metal film on the substrate through pulsed laser direct writing.

Furthermore, the metal microstructure array is formed by scanning the metal film on the substrate with laser; the metal microstructure array includes the plurality of metal microstructure units; and by controlling a laser parameter, the metal film in a region where a scanning path passes through melts and dewets to form the metal nanostructures under a surface tension.

Furthermore, by changing a laser processing parameter, the metal nanostructures with different shapes, sizes, and densities are formed.

Furthermore, by changing laser parameters in different regions, different spatial distribution states of the metal nanostructure array are achieved.

Furthermore, the laser has a power density of 10 $\mu J/cm^2$ to 100 $mJ/cm^2$, a pulse width of 10 ps to 500 ns, and a wavelength of 200 nm to 1,700 nm.

Furthermore, a size of the plurality of metal microstructure units ranges from a micron order to a sub-millimeter order, and a shape of the plurality of metal microstructure units is designed arbitrarily.

Furthermore, a size of the metal nanostructures ranges from a nanometer order to a sub-micron order, and the metal nanostructures are designed arbitrarily.

Furthermore, the metal microstructure array is made of a component including but not limited to gold or silver.

Furthermore, the metal nanostructures are made of a component including but not limited to gold or silver; and a shape of the metal nanostructures includes but is not limited to a spherical shape, a radial shape, a polyhedral shape, a linear shape, etc.

The present disclosure has following advantages.

In the high-sensitivity terahertz sensor proposed by the present disclosure, the metal microstructure array forms the metasurface to achieve localized enhancement of the terahertz wave. There is a "point effect" among the metal nanostructures located at the gaps of the microstructure array, which further enhances the local terahertz field strength. Ultimately, the present disclosure utilizes the metasurface and the metal nanostructures to cooperatively enhance the terahertz wave, promoting full interaction between the terahertz wave and the analyte and improving terahertz detection sensitivity.

The sensor proposed by the present disclosure can be prepared by etching through pulsed laser direct writing, greatly simplifying the processing flow, reducing processing costs, achieving high processing flexibility, and shortening processing cycles, thereby promoting the development and application of terahertz sensing technology.

DETAILED DESCRIPTION OF THE EMBODIMENTS

Figure 1:
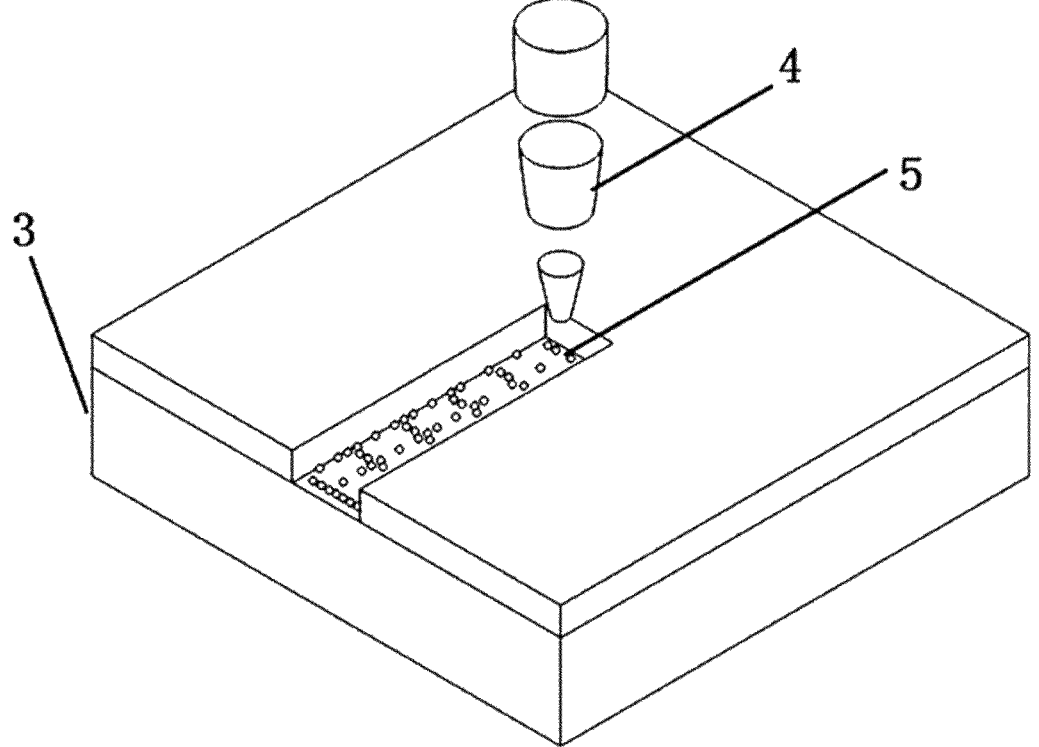
FIG. 1 is a schematic diagram of a preparation method of a high-sensitivity terahertz sensor according to an embodiment of the present disclosure.

To make the above objectives, features, and advantages of the present disclosure more apparent and easily understood, the specific implementations of the present disclosure are described in detail below in conjunction with the drawings. The following describes many details in order to provide a thorough understanding of the present disclosure. However, the present disclosure can be implemented in many other different ways, and those skilled in the art can make similar improvements without departing from the connotation of the present disclosure. Therefore, the present disclosure is not limited to the specific implementations disclosed below.

According to an embodiment of the present disclosure, a high-sensitivity terahertz sensor includes a substrate, a metal microstructure array, and metal nanostructures. The metal microstructure array includes a plurality of metal microstructure units and covers a substrate. The metal nanostructures are located at gaps of the metal microstructure array. The metal microstructure array forms a metasurface to achieve localized enhancement of a terahertz wave. The metal nanostructures located at the gaps of the microstructure array further enhance a local terahertz field strength. Ultimately, the design utilizes the metasurface and the metal nanostructures to cooperatively enhance the terahertz wave, promoting full interaction between the terahertz wave and the analyte and improving terahertz detection sensitivity.

The sensor has a metal film etched on the substrate through pulsed laser direct writing, thereby conveniently preparing metal microstructure arrays and nanostructures of different shapes. Specifically, a preparation method of a high-sensitivity terahertz sensor according to an embodiment of the present disclosure includes the following steps. A metal film on a substrate is scanned with laser to form a metal microstructure array. The metal microstructure array includes a plurality of metal microstructure units. By controlling a laser parameter, the metal film in a region where a scanning path passes through melts and dewets to form metal nanostructures under a surface tension.

Furthermore, by changing a laser processing parameter, the metal nanostructures with different shapes, sizes, and densities are formed. By changing laser parameters in different regions, different spatial distribution states of the metal nanostructure array are achieved.

Furthermore, the laser has a power density of 10 µJ/cm² to 100 mJ/cm², a pulse width of 10 ps to 500 ns, and a wavelength of 200 nm to 1,700 nm.

Furthermore, a size of the metal microstructure unit ranges from a micron order to a sub-millimeter order, and a shape of the metal microstructure unit is designed arbitrarily. A size of the metal nanostructure ranges from a nanometer order to a sub-micron order, and the metal nanostructure is designed arbitrarily. The metal microstructure array is made of a component including gold or silver. The metal nano-structure is made of a component including but not limited to gold or silver. A shape of the metal nanostructure includes but is not limited to a spherical shape, a radial shape, a polyhedral shape, a linear shape, etc.

Embodiment 1

A thickness of a silicon substrate is 300 µm, and a thickness of a silver film on the silicon substrate is 10 nm.

A preparation method for a high-sensitivity terahertz sensor specifically includes the following preparation steps.

Step 1. A parameter of a pulse laser is adjusted, including a laser power density of 1 mJ/cm², a pulse width of 10 ns, and a wavelength of 1,064 nm.

Step 2. A pulsed laser is focused onto a surface of the silver film.

Step 3. A pulsed laser path is adjusted according to a shape of a metal microstructure for processing with a laser scanning speed of 10 mm/s.

Figure 2:
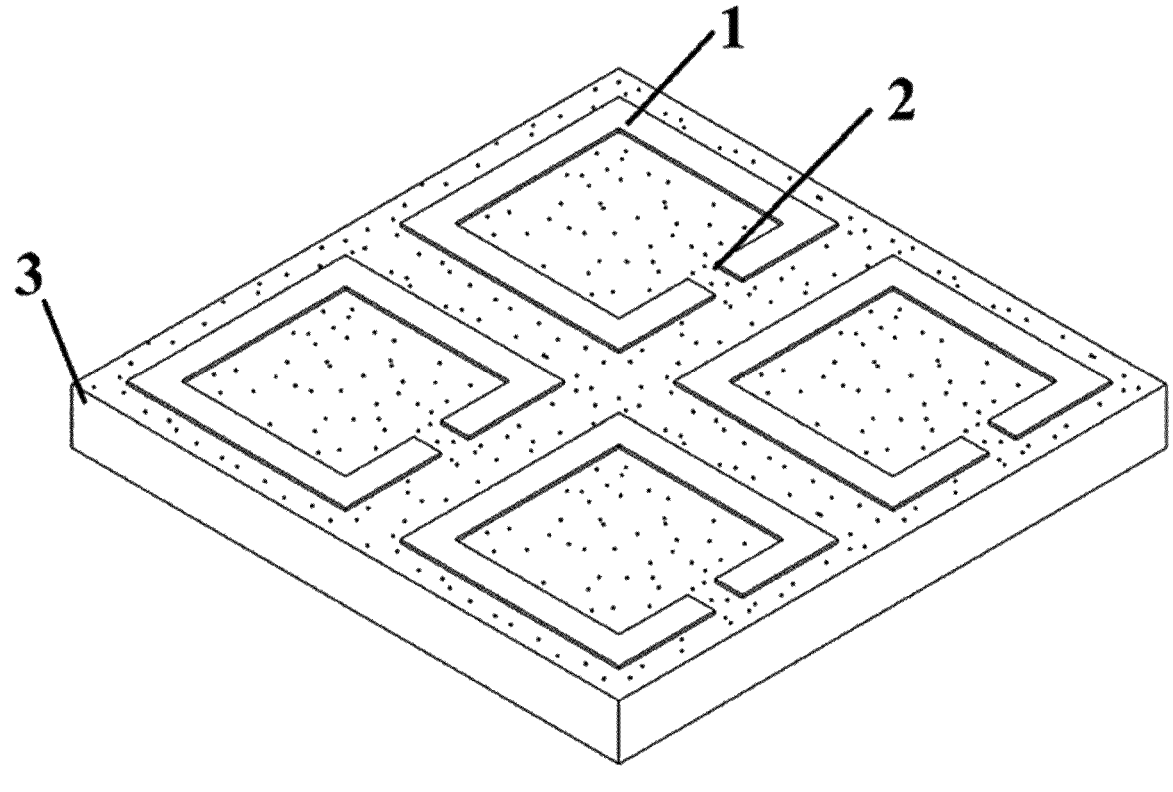
FIG. 2 is a schematic diagram of a high-sensitivity terahertz sensor according to Embodiment 1 of the present disclosure.

The metal film on the laser scanning path melts to form a uniform nano-metal structure under a surface tension, resulting in a sensor structure shown in FIG. 2. The metal microstructure has a line width of 5 µm, a gap spacing of 5 µm, and a period of 200 µm. The metal nanostructure has an average diameter of 80 nm and covers an entire metasurface.

A content of chlorothalonil was measured by the sensor. An experimental result demonstrates that the sensor can detect a minimum of 10 ng of chlorothalonil. In comparison, the minimum detection capacity of a terahertz metasurface sensor prepared by photolithography and lacking a nanostructure for synergistic enhancement is about 1 µg. Therefore, the sensor sensitivity of the present disclosure is improved by about 100 times.

Embodiment 2

A thickness of a silicon substrate is 300 µm, and a thickness of a silver film on the silicon substrate is 10 nm.

A preparation method for a high-sensitivity terahertz sensor specifically includes the following preparation steps.

Step 1. A parameter of a pulse laser is adjusted, including a laser power density of 100 µJ/cm², a pulse width of 15 ps, and a wavelength of 1,064 nm.

Step 2. A pulsed laser is focused onto a surface of the silver film.

Step 3. A pulsed laser path is adjusted for processing with a scanning speed of 100 mm/s. The metal film completely peels off on the laser scanning path.

Step 4. The parameter of a pulse laser is adjusted, including a laser power density of 1 mJ/cm², a pulse width of 10 ns, and a wavelength of 1,064 nm. The pulsed laser path is adjusted for processing with a scanning speed of 30 mm/s. The metal film on the laser scanning path melts to form a uniform nano-metal structure under a surface tension.

Figure 3:
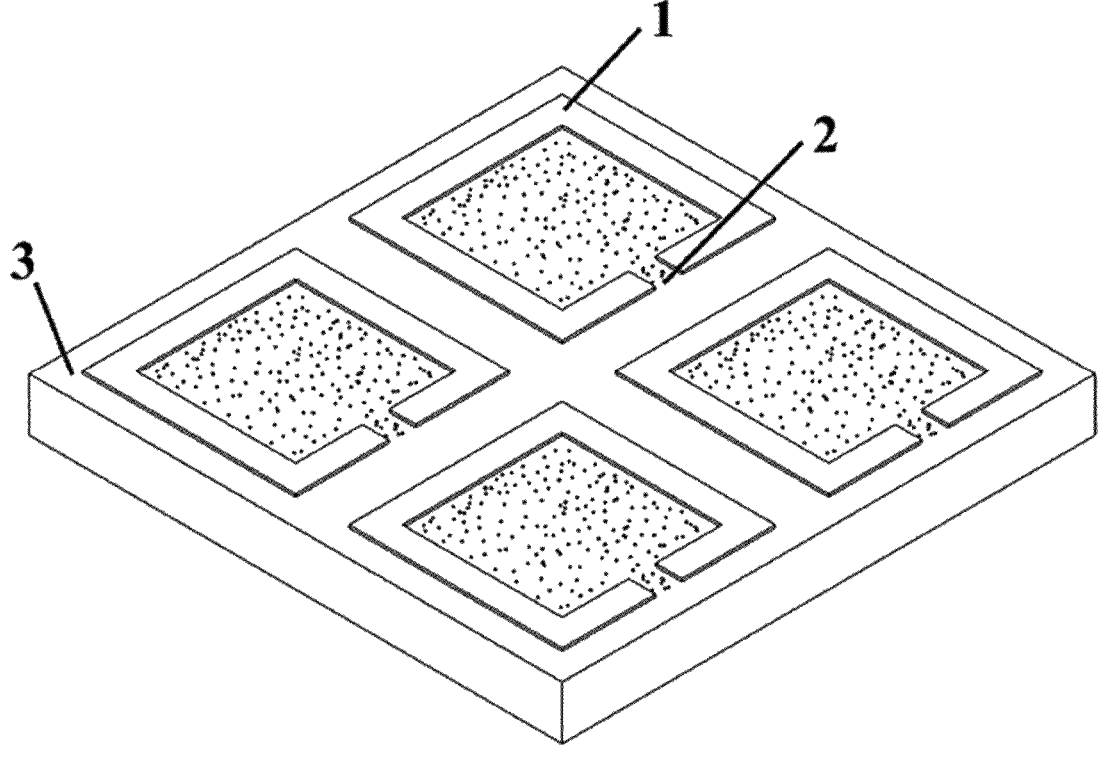
FIG. 3 is a schematic diagram of a high-sensitivity terahertz sensor according to Embodiment 2 of the present disclosure.

Thus, a sensor structure shown in FIG. 3 is formed. The metal microstructure has a line width of 5 µm, a gap spacing of 5 µm, and a period of 200 µm. The metal nanostructure has an average diameter of 80 nm and covers a metasurface locally.

Through the above process, a content of chlorothalonil was measured by the sensor. An experimental result demonstrates that the sensor can detect a minimum of 23 ng of chlorothalonil. In comparison, the minimum detection capacity of a terahertz metasurface sensor prepared by photolithography and lacking a nanostructure for synergistic enhancement is about 1 µg. Therefore, the sensor sensitivity of the present disclosure is improved by about 43 times.

Embodiment 3

A thickness of a silicon substrate is 300 µm, and a thickness of a silver film on the silicon substrate is 20 nm.

A preparation method for a high-sensitivity terahertz sensor specifically includes the following preparation steps.

Step 1. A parameter of a pulse laser is adjusted, including a laser power density of 3 mJ/cm$^2$, a pulse width of 10 ns, and a wavelength of 1,064 nm.

Step 2. A pulsed laser is focused onto a surface of the silver film.

Step 3. A pulsed laser path is adjusted for processing with a scanning speed of 100 mm/s. The metal film completely peels off on the laser scanning path.

Step 4. The parameter of a pulse laser is adjusted, including a laser power density of 3 mJ/cm$^2$, a pulse width of 10 ns, and a wavelength of 1,064 nm. The pulsed laser path is adjusted for processing with a scanning speed of 50 mm/s. The metal film on the laser scanning path melts to form a uniform nano-metal structure under a surface tension.

Figure 4:
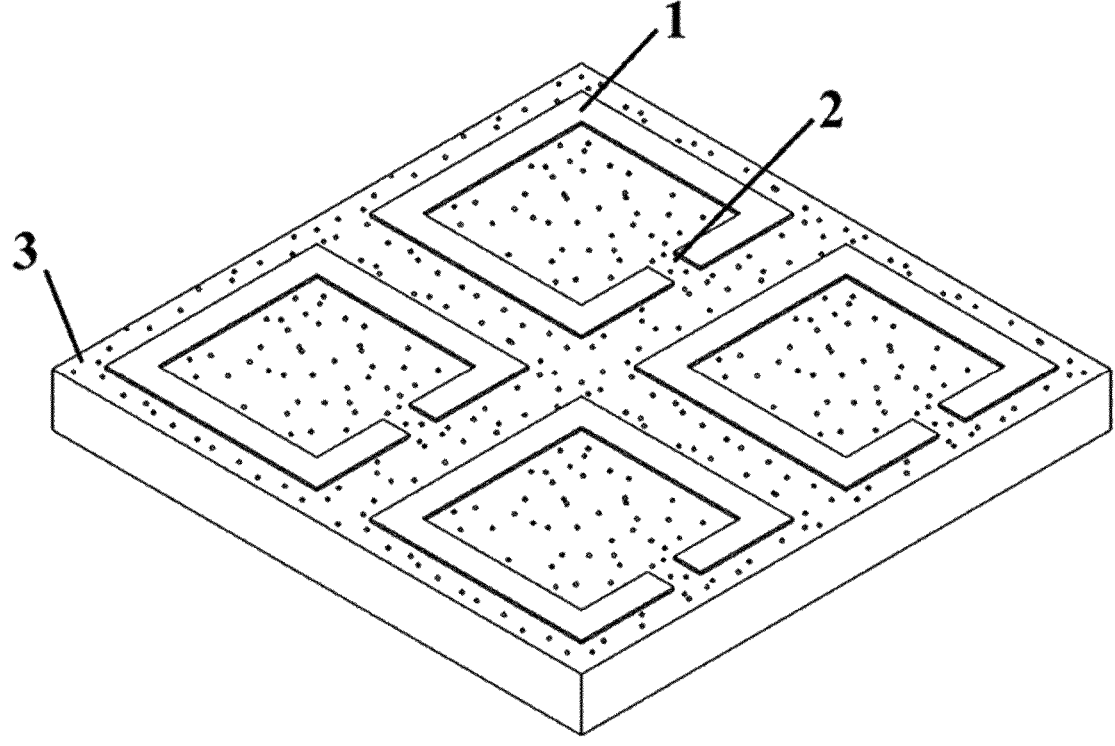
FIG. 4 is a schematic diagram of a high-sensitivity terahertz sensor according to Embodiment 3 of the present disclosure.

Thus, a sensor structure shown in FIG. 4 is formed. The metal microstructure has a line width of 5 μm, a gap spacing of 5 μm, and a period of 200 μm. The metal nanostructure has a diameter of 200 nm. The laser parameter is controlled to change the diameter of the metal nanostructures. The metal nanostructures cover the entire surface.

Through the above process, a content of chlorothalonil was measured by the sensor. An experimental result demonstrates that the sensor can detect a minimum of 75 ng of chlorothalonil. In comparison, the minimum detection capacity of a terahertz metasurface sensor prepared by photolithography and lacking a nanostructure for synergistic enhancement is about 1 μg. Therefore, the sensor sensitivity of the present disclosure is improved by about 13 times.

The above embodiments are merely some implementations of the present disclosure. Although the description is specific and detailed, it should not be construed as a limitation to the patent scope of the present disclosure. It should be noted that those of ordinary skill in the art can further make several variations and improvements without departing from the concept of the present disclosure, and all these variations and improvements fall within the protection scope of the present disclosure. Therefore, the protection scope of the present disclosure is subject to the appended claims.

The invention claimed is:

1. A preparation method of a high-sensitivity terahertz sensor, wherein the high-sensitivity terahertz sensor comprises:

a substrate;

6 a metal microstructure array, comprising a plurality of metal microstructure units, and covering the substrate to form a metasurface; and metal nanostructures, located at gaps of the metal microstructure array;

the preparation method comprising:

step 1: adjusting parameters of pulsed laser, comprising a laser power density of 1 mJ/cm2, a pulse width of 10 ns, and a wavelength of 1064 nm;

step 2: focusing the pulsed laser onto a surface of a silver film; and step 3: adjusting a scanning path of the pulsed laser according to a shape of a metal microstructure for processing with a laser scanning speed of 10 mm/s, such that the metal film on the scanning path of the pulsed laser melts to form the metal nanostructures under a surface tension.

2. The preparation method of the high-sensitivity terahertz sensor according to claim 1, wherein laser processing parameters are changed to form the metal nanostructures with different shapes, sizes, and densities.

3. The preparation method of the high-sensitivity terahertz sensor according to claim 1, wherein laser processing parameters in different regions are changed to achieve different spatial distribution states of the metal nanostructure array.

4. The preparation method of the high-sensitivity terahertz sensor according to claim 1, wherein a size of the plurality of metal microstructure units ranges from a micron order to a sub-millimeter order, and a shape of the plurality of metal microstructure units is designed arbitrarily.

5. The preparation method of the high-sensitivity terahertz sensor according to claim 1, wherein a size of the metal nanostructures ranges from a nanometer order to a sub-micron order, and the metal nanostructures are designed arbitrarily.

6. The preparation method of the high-sensitivity terahertz sensor according to claim 1, wherein the metal microstructure array is made of a component comprising gold or silver.

7. The preparation method of the high-sensitivity terahertz sensor according to claim 1, wherein the metal nanostructures are made of a component comprising gold or silver.

* * * * *